United States Patent [19]

Uemura et al.

[11] Patent Number: 4,472,693

[45] Date of Patent: Sep. 18, 1984

[54] NOISE FILTER AND TERMINAL STRUCTURE THEREFOR

[75] Inventors: Hiroyuki Uemura, Narashino; Akira Nakamura, Funabashi; Tadaharu Akino, Kashiwa; Hitoshi Okuyama, Sakra; Matuo Fukuoka, Ichikawa, all of Japan

[73] Assignee: TDK Corporation, Tokyo, Japan

[21] Appl. No.: 368,431

[22] Filed: Apr. 14, 1982

[30] Foreign Application Priority Data

Apr. 30, 1981 [JP] Japan .............................. 56-61654[U]
Aug. 20, 1981 [JP] Japan ............................ 56-122422[U]

[51] Int. Cl.³ .......................... H03H 7/01; H03H 1/00
[52] U.S. Cl. ................................. 333/167; 174/65 R; 333/175; 333/185
[58] Field of Search ............................. 333/167–182, 333/185, 184; 174/52 PE, 59–64, 65 R, 66, 67, 68 R

[56] References Cited

U.S. PATENT DOCUMENTS 3,135,822 6/1964 Baran et al. ................. 174/65 R X Primary Examiner—Marvin L. Nussbaum
Attorney, Agent, or Firm—Robert Scobey

[57] ABSTRACT

A noise filter and terminal structure therefor are disclosed. An insulator case composed of a case main body and a cap are utilized, with the case main body including coil fixing projections and capacitor position restricting ribs. A plurality of metallic terminals provide electrical connections to the electrical components within the insulator case and extend out of that case between adjacent edges of the case main body and cap. The metallic terminals are generally flat, with a generally U-shaped bent portion and a connection part extending from the bent portion. The bent portion is fitted into a corresponding concave part in the case main body. The connection part includes hook-shaped projections adapted to hold a wire, and the projections of all terminals are at generally the same level to facilitate automatic soldering.

8 Claims, 9 Drawing Figures

NOISE FILTER AND TERMINAL STRUCTURE THEREFOR

BACKGROUND AND BRIEF DESCRIPTION OF THE INVENTION

This invention relates to a noise filter, particularly suited for power supply line filtering and the like. The invention also relates to a terminal structure especially suited for use in such a noise filter and the like.

An electrical device, such as a noise filter is usually constructed so that metallic terminals are fixed to a case of synthetic resin, and inner electrical wires are connected to the metallic terminals by a soldering operation. In recent years, there has been great demand for automatic manufacturing, particularly requiring the automated connection of the metallic terminals to the interior wires. However, the connection between conventional metallic terminals and the wires has been difficult to automate, since holes or grooves are used for inserting the wire. Sometimes it is necessary to provide a manual insertion of a wire into the wire connection part in a metallic terminal, and further the wire should be held manually until the soldering operation is completed so that the wire is not removed from the terminal.

The present invention has as one of its objects a terminal structure that eliminates the above-mentioned disadvantages and as being suitable for the automated feeding and holding and soldering of a wire to the metallic terminal.

A major object of the present invention is a noise filter that reduces manufacturing cost and improves mass production. These objects are achieved through use of a noise filter provided by an insulator case composed of a case main body and a cap that include interfitting elements which resiliently engage each other to maintain the case main body and cap fitted together. The case main body includes coil fixing projections and capacitor position restricting ribs, as well as a number of metallic terminals that provide electrical connections to the electrical components within the insulator case. Portions of the metallic terminals extend outside the insulator case and are firmly held between adjacent edges of the case main body and cap. These terminals advantageously are each provided with a U-shaped bent portion which fits into a concave part in the case main body. Each metallic terminal includes a connection part within the case main body that extends substantially vertically, with the upper end of this connection part including opposed hook-shaped projections that are adapted to hold a wire therebetween. These hook-shaped connection parts are preferably all positioned at the same level within the case main body, to facilitate an automated soldering operation.

The invention will be more completely understood by reference to the following detailed description.

DETAILED DESCRIPTION

Figure 1:
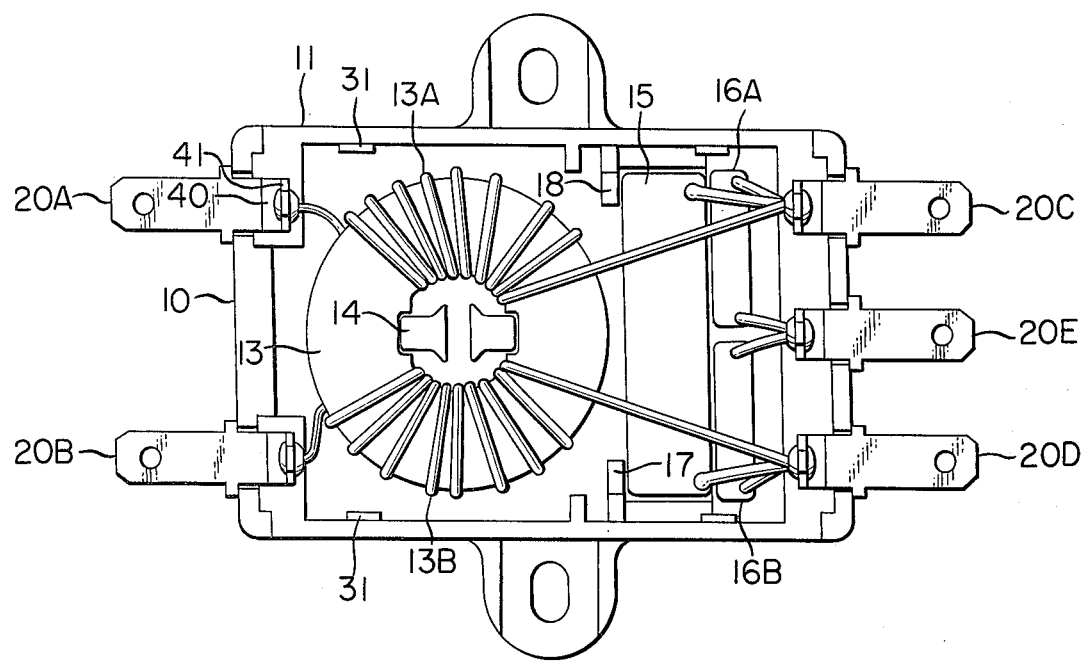
FIG. 1 is a top plan view illustrating one preferred embodiment of noise filter constructed in accordance with the present invention.
Figure 2:
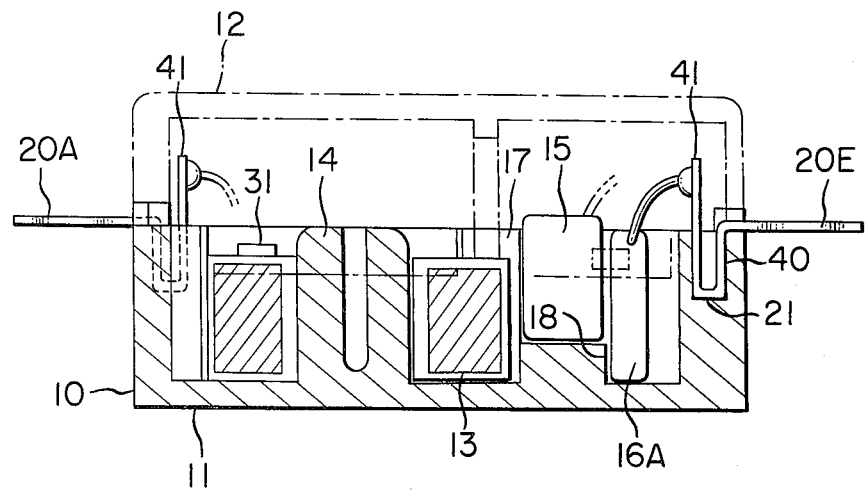
FIG. 2 is a side sectional view of the noise filter of FIG. 1.
Figure 3:
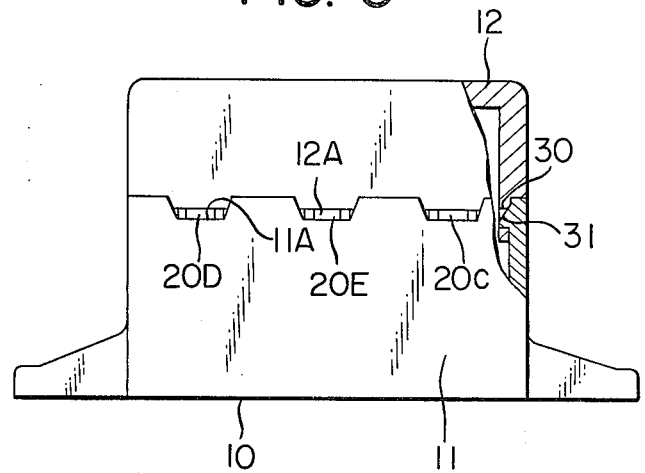
FIG. 3 is an end elevational view of the noise filter of FIG. 1.

Referring now to FIGS. 1 to 3, an insulator case 10 which is made of insulating synthetic resin or the like is divided into a case main body 11 and a cap 12. The insulator case is preferably made of an insulating synthetic resin material having resiliency and superior heat-resistance and molding. For example, a suitable material has glass of 10 to 30% by volume mixed with PBT (polybutyleneterephthalate) resin. The mechanical strength of the case is improved by mixing glass therewithin, and further its heat-resistance and surface condition (found in the molding) are improved. Mixing of glass in the resin may eliminate shrinkage of the resin, which occurs when a molding operation is performed. However, mixing of glass exceeding over 30% by volume may cause poor molding, decreased resiliency, and may render the case fragile.

The case main body 11 is provided with a coil fixing projection 14 for use in fixing a common mode choke coil 13 (which may utilize, e.g., any one of a ferrite core, amorphous metal core, and the like, applied in the bobbin, with the winding then made on the core), and capacitor position restricting ribs 17, 18 are used in fixing the positions of capacitor 15 for filtering noise of symmetrical wave component elements and capacitors 16A, 16B for filtering noise of non-symmetrical wave component elements. At the upper end surface of the case main body 11 are formed terminal position setting concave parts 21 used to position metallic terminals 20A to 20E. At the inner side surfaces of the case main body 11 are formed a plurality of engaging projections 31 to be resiliently fitted into corresponding engaging concave portions 30 in the cap 12. The terminals 20A to 20E are generally flat and have at their rear end portions an integral assembly formed of a generally U-shaped bent portion 40 and a connection part 41 extending linearly upwardly from the rear end of the U-shaped bent portion 40. Each of the terminals 20A to 20E is arranged such that the U-shaped bent portion 40 is fitted into the terminal position setting concave part 21 in the case main body, and the heights of the connection parts 41 where soldering is performed are all preferably set at substantially the same elevation (although it is possible to vary the elevation). The ends of one of the windings 13A of the common mode choke coil 13 are connected to the terminals 20A and 20C, and the ends of the other winding 13B are connected to the terminals 20B and 20D. In the case of a ferrite or the like having a high insulation, only one of the coil lines may be insulated (such as by covering an insulator tube over the line). Since the case 10 is made of an insulator material, only the insulation between the coil lines may be sufficient for insulating purposes. Between the terminals 20C and 20D is connected a capacitor 15 as well as the series circuit of capacitors 16A and 16B, and an intermediate connection point of the capacitors 16A, 16B is connected to the terminal 20E applied as an earth or ground terminal. Connections between these coils, and the capacitor and each of the terminals may be performed by a soldering operation through use of an automatic soldering device since the connections 41 of all of the terminals are set at the same elevation, and their planar positions are thus determined in advance. Upon completion of the soldering operation, the cap 12 is fitted to the case main body 11, and the engaging projections 31 on the case main body are resiliently fitted into the corresponding concave portions 30 in the cap. At such time each of the terminals 20A to 20E is held and fixed by the end faces of the case main body 11 and the cap 12. Specifically, as best shown in FIG. 3, the case main body 11 includes depressions 11A along an edge thereof, and cap 12 includes projections 12A that extend into the depressions and bear against portions of the terminals (20C–20E in FIG. 3) that extend outside the case 10, so as to aid in holding the terminals in place.

The preferred embodiment described above exhibits the following effects:

(1) The elevations of the connection parts of terminals 20A to 20E are preferably equal, so that automated soldering may easily be performed with an automatic soldering machine during a manufacturing process, to improve mass productivity as well as reduce cost.

(2) Each of the terminals 20A to 20E has at its rear portion a substantially U-shaped bent part 40, and this bent part is adapted to be fitted into the terminal position setting concave part 21 in the case main body, so that neither removal nor retraction of the terminals may be made. Further, each of the terminals is held by the edge surfaces of the case main body 11 and the cap 12, so that the terminal may not be moved in a vertical direction. Each terminal is thereby securely held.

(3) Insulator case 10 is composed of the case main body 11 and the cap 12, so that no inner injection molding of synthetic resin is required, reducing use of resin material and manufacturing cost.

(4) Since the coil fixing projections 14 and capacitor position restricting ribs 17, 18 are integrally formed in the case main body 11, it is possible to pre-establish the positions of the coil 13 and the capacitors 15, 16A, 16B without performing any molding of synthetic resin material. Thus it is possible to provide desired insulation distances and component positioning in advance.

Figure 4:
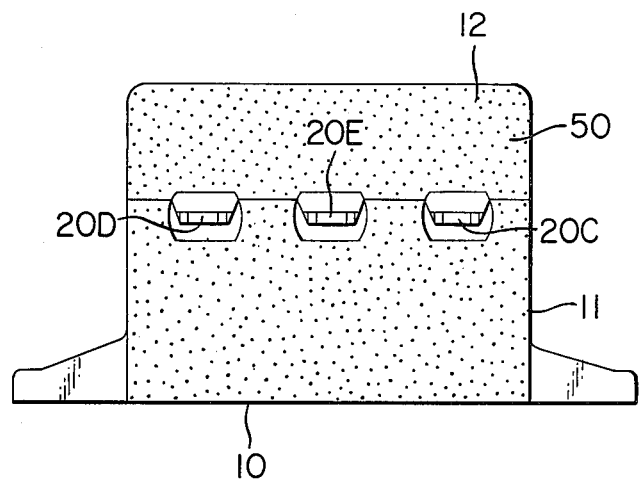
FIG. 4 is an end elevational view of another preferred embodiment of the present invention.
Figure 5:
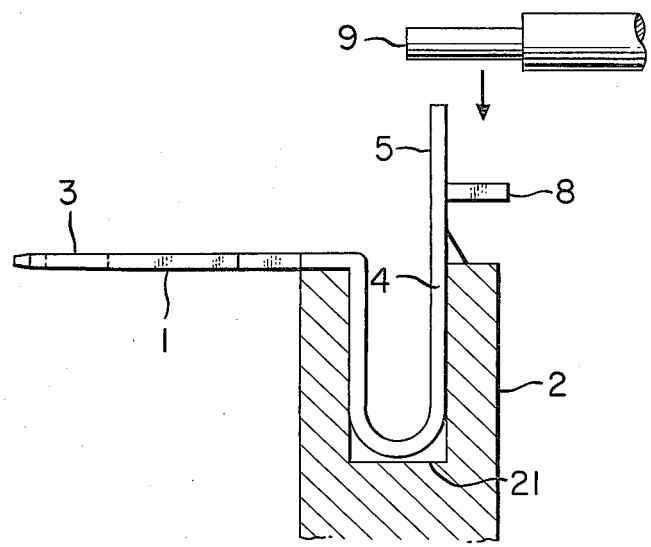
FIG. 5 is a side elevational view, partly in section, illustrating one preferred embodiment of terminal structure in accordance with the present invention, and before a wire is installed in it.
Figure 6:
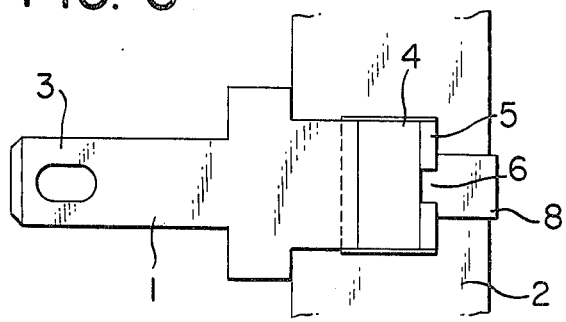
FIG. 6 is a top plan view of FIG. 5.
Figure 7:
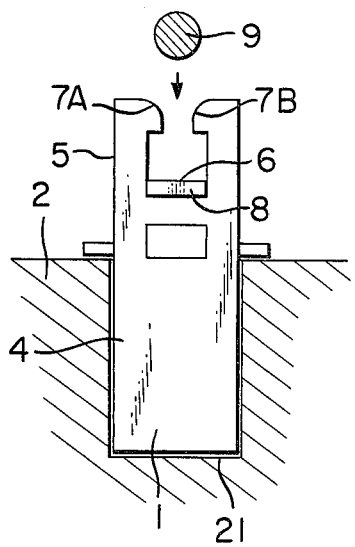
FIG. 7 is a rear view of the terminal structure of FIG. 6.

In FIG. 4 is illustrated another preferred embodiment of the present invention. In this figure, the outer surface of the insulator case 10 (composed of the case main body 11 and the cap 12) is plated, as at 50, by metal except adjacent to the terminals 20A to 20E. The inner structure of the insulator case 10 is the same as previously described. Electrostatic shielding is applied in case of non-magnetic metals such as Zn, Ni, and their alloys, or Al, or the like. Electromagnetic shielding is applied in case of magnetic metals. Vapor coating, spraying, molten spraying, and the like are applied as a forming process.

FIGS. 5 to 9 show a preferred form of metallic terminal 1 that may constitute any of the terminals 20A–20E of FIGS. 1 to 4. The terminal 1 is constructed to include a substantially flat terminal part constituting an outer coupling projected horizontally out of case 2, a substantially U-shaped bent part 4, and a wire connection part 5 extending from the bent 4 substantially vertically; all these parts of terminal 1 are formed integrally. The top end part of the wire connection part 5 is divided into two forks, and a wire holding groove 6 is formed at the central part of this wire connection part. Opposing projections 7A, 7B are formed at the inner sides of the top ends of the forks. Further, a bent tongue 8 is formed so as to provide a bottom surface of the wire holding groove 6. The bent tongue 8 is formed correspondingly when the wire holding groove 6 is press formed in the wire connection part. The case 2 is preferably composed of an insulator material as described above in connection with FIGS. 1 to 4, and includes a terminal position setting concave part 21 into which the U-shaped bent part 4 is fitted.

Figure 8:
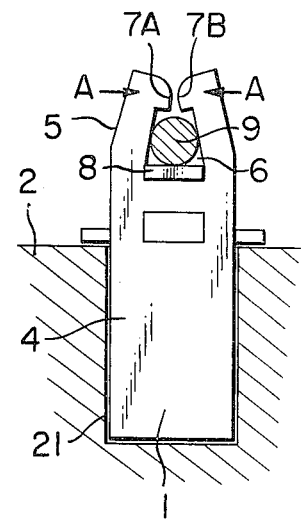
FIG. 8 is a rear view similar to FIG. 7, showing a wire being held.
Figure 9:
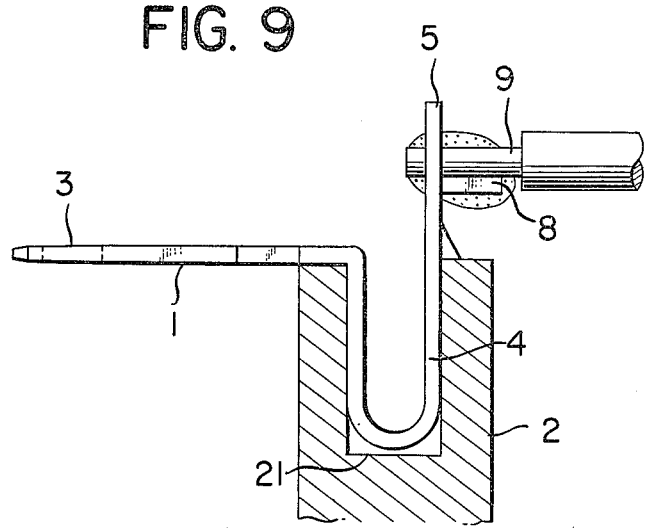
FIG. 9 is a side elevational view, partly in section and like FIG. 5, illustrating a condition in which the wire is soldered to the metallic terminal.

With this arrangement, the U-shaped bent part 4 of the metallic terminal 1 is fitted and fixed into the terminal position setting concave part 21 in the case 2, and then wire 9 is set or inserted into the wire holding groove 6. Then, as shown in FIG. 8, a force is applied to the fork portions of the wire connection part 5 in the direction of arrow A so as to press fit the wire 9 to prevent its removal. During this condition the soldering operation is completed, and since, as shown in FIG. 9, the bent tongue 8 is kept positioned along the wire 9, a heavy soldering operation may be performed.

The following effects are exhibited:

(1) All the feeding of wire 9 in the wire holding groove 6, the press fitting of the wire connecting part 5, and the soldering of the wire 9 against the metallic terminal 1 may be performed automatically. That is, it is possible to eliminate manual operations.

(2) Since the bent tongue 8 is formed to make a bottom surface of the wire holding groove 6, it is possible to increase the soldering area and thereby improve the reliability of the soldering operation.

(3) Press fitting the U-shaped bent portion 4 into the terminal position setting concave part 11 ensures a stable positioning of the metallic terminal 1, resisting removal forces as may be generated.

As described above, a terminal structure is provided in which the feeding of wire to the metallic terminal, and the holding of the wire and its soldering operation are facilitated; automation is also facilitated. Further, manufacturing and mass production operations are facilitated, including automatic soldering without requiring any injection molding of synthetic resin.

The preferred embodiments described above are susceptible of modification. Thus the invention should be taken as defined by the following claims.

We claim:

1. A noise filter comprising an insulator case composed of a case main body and a cap, said case main body including coil fixing projections and capacitor position restricting ribs, a plurality of metallic terminals providing electrical connections to the electrical components within said insulator case and extending out of said insulator case between adjacent edges of said case main body and cap, and a coil and capacitor positioned within said case main body and fixed therein respectively by said coil fixing projections.

2. A noise filter as set forth in claim 1, in which said metallic terminals are generally flat with a generally U-shaped bent portion and a connection part extending from said U-shaped bent portion, said case main body having a concave part into which said U-shaped bent portion is fitted.

3. A noise filter as set forth in claim 1, in which the outer surface of said insulator case includes a metallic layer except for the areas thereof around said metallic terminals.

4. A noise filter as set forth in claim 1, in which said adjacent edges of said case main body and said cap include interfitting elements which resiliently engage each other to maintain said case main body and cap fitted together to form said insulator case.

5. A noise filter as set forth in claim 1, in which the portions of said metallic terminals extending out of said insulator case lie within depressions in the edge of said case main body, and said adjacent edge of said cap includes projections extending into said depressions and bearing against said portions of said metallic terminals.

6. A noise filter as in claim 1, in which said metallic terminals include connection parts thereof all at substantially the same level within said case main body to facilitate automatic soldering of electrical leads to said connection parts.

7. A noise filter as in claim 1, in which each of said metallic terminals includes a connection part within said case main body and extending substantially vertically, the upper end of said connection part having opposed hook-shaped projections adapted to hold a wire therebetween.

8. A noise filter as in claim 7, in which said hook-shaped projections extend upwardly from a substantially horizontally disposed tongue which supports said wire and to which said wire is soldered.

* * * * *